USOO5638380A

United States Patent [19]
De

[11] Patent Number: 5,638,380
[45] Date of Patent: Jun. 10, 1997

[54] PROTECTING PROPRIETARY ASIC DESIGN INFORMATION USING BOUNDARY SCAN ON SELECTIVE INPUTS AND OUTPUTS

[75] Inventor: Kaushik De, San Jose, Calif.

[73] Assignee: LSI Logic Corp., Milpitas, Calif.

[21] Appl. No.: 616,070

[22] Filed: Mar. 14, 1996

[51] Int. Cl.⁶ .................................................. G01R 31/28
[52] U.S. Cl. .................. 371/22.3; 371/25.1; 364/488; 364/489
[58] Field of Search ........................ 371/22.3, 25.1, 371/27, 22.2, 22.5; 364/489, 488, 580, 581; 324/73 R

[56] References Cited

U.S. PATENT DOCUMENTS

| | | | |
|---|---|---|---|
| 5,012,471 | 4/1991 | Powell et al. | 371/27 |
| 5,132,974 | 7/1992 | Rosales | 371/22.3 |
| 5,291,495 | 3/1994 | Udell | 371/22.3 |
| 5,396,435 | 3/1995 | Geinetti | 364/489 |
| 5,414,716 | 5/1995 | Bershteyn | 371/27 |
| 5,524,082 | 6/1996 | Horstmann et al. | 364/489 |

OTHER PUBLICATIONS

International Test Conference 1991, Paper 14–2, Hierarchical Test Program Development For Scan Testable Circuits, pp. 375–384.

Primary Examiner—Robert W. Beausoliel, Jr.
Assistant Examiner—Nadeem Iqbal
Attorney, Agent, or Firm—Oppenheimer Poms Smith

[57] ABSTRACT

A method of choosing non-scan I/O nodes to replace with scan I/O nodes so as to allow the greatest amount of proprietary information to be removed from an ASIC core netlist which is to be supplied to an ASIC customer, includes the steps of assigning weights to core gates based upon how competitively sensitive those gates are determined to be, assigning a value to each non-scan I/O node based upon the sum of weights of all gates to which the I/O node is connected, and replacing the non-scan I/O node having the greatest value with a scan node. Gates that are within the timing shell are assigned a weight of zero. I/O nodes that are performance critical are assigned a value of zero, and the weights of all gates connected to such performance-critical I/O's are also set to zero. The I/O node selection process is iterative, with the weight of a gate being set to zero when it is connected to more non-scan I/O nodes than are remaining to be chosen.

22 Claims, 9 Drawing Sheets

PROTECTING PROPRIETARY ASIC DESIGN INFORMATION USING BOUNDARY SCAN ON SELECTIVE INPUTS AND OUTPUTS

BACKGROUND OF THE INVENTION

1. Field of the Invention

The present invention generally relates to the art of microelectronic integrated circuits, and more specifically to the art of protecting proprietary ASIC design information using boundary scan on selective inputs and outputs.

2. Description of the Related Art

Application specific integrated circuits (ASICs) are full custom or semicustom microcircuits. Typically, the ASIC vendor supplies to the customer (ASIC designer) an ASIC library containing small scale functional blocks (primitives) as well as large scale functional blocks (cores). The customer then designs an ASIC to its own specification using these primitives and cores as building blocks. Depending on the software tools used by the customer, the customer may either work with these modules as individual building blocks using schematic capture techniques, or the customer may specify the circuit using a descriptive language such as VHDL or Verilog. In the latter case, a synthesis tool receives the descriptive language input, and synthesizes a circuit netlist that will implement the functionality specified by the customer. ASICs may also be designed using a combination of schematic capture and synthesis methods.

Cores may range in size up to extremely large functional blocks such as a mini Reduced Instruction Set Computer (RISC) processor. As integration levels rise, customers demand cores with greater functionality with which to implement their designs. The detailed design of large cores is usually considered proprietary information. Because it is desirable to maintain the detailed design of the core as proprietary information, it is desirable that the customer be given only the functional description and input/output timing diagrams of the cores so that he can use them in his design, and not be given the detailed design of the cores. Accordingly, the customer is supplied with a synthesis shell, which is a high level description of the implementation of the core, containing enough information for optimization to the synthesis tool regarding the core. The customer is also provided with a timing shell, which contains the input/output timing specifications of the core. Beyond these two shells, the customer does not need to know the detailed implementation of the core. Accordingly, the customer is not provided with internal design details.

After the ASIC has been designed and manufactured, the chip must be tested for any manufacturing defects. This involves first simulating the ASIC using a variety of input test patterns, and recording the simulation output results which represent the expected outputs of a properly functioning ASIC. The input test patterns are then applied to the actual ASIC. The actual outputs are compared to the expected outputs. Deviations from the expected outputs indicate that the ASIC has a manufacturing defect.

Logic buried deep within the ASIC may require an enormous number of test patterns to test. To facilitate testing, scan cells are added to the ASIC at strategic locations. Scan cells are points at which logic values may be forced into the ASIC (scan writable gates) and/or observed within the ASIC (scan readable gates). Scan cells normally take the form of flip-flops which may be forced to the desired logic value, and which may be read from outside the ASIC. For example, scan cells enable the tester to preset a counter within the ASIC to a particular count, and to verify that combinatorial logic derived from the counter outputs is working properly. In general, non-scan flip flops are converted into scan flip-flops by adding some additional logic gates, including a multiplexer. Strategic placement of scan cells within an ASIC allows the number of test patterns required to fully test an ASIC to be drastically reduced. This is important primarily because the computer simulations necessary to produce the test patterns and expected resulting outputs require a great deal of computer resources. Without scan cell techniques, simulation times to produce test patterns that adequately test an ASIC would be impractically long. Furthermore, without scan cells some gates within an ASIC may be simply not testable. However, using scan cells it is possible to develop test patterns that will detect 99% or more of possible gate failures using a set of test patterns that is not impractically long. The fault coverage obtained is the percentage of possible gate failures that will be detected by a given set of test patterns. Scan cells are normally connected in long chains, allowing all of the scan cells to be written to or read from using only a few dedicated test I/O pins on the ASIC.

Figure 1:
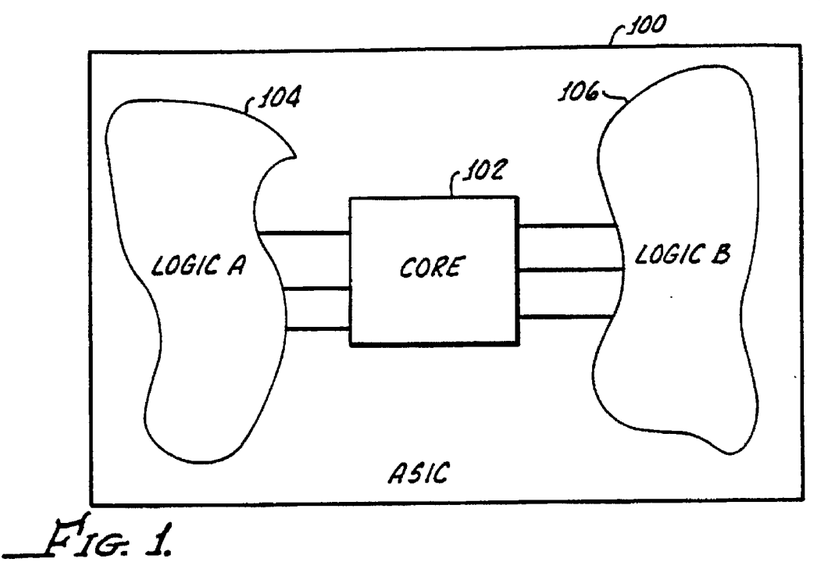
FIG. 1 is a conceptual drawing showing an embedded core within an ASIC.

ASIC designs using embedded cores present a challenge to test. FIG. 1 illustrates the use of embedded core logic within an ASIC 100. Core 102 is a high level functional block designed by the ASIC vendor, and available to the customer as a library component. Core 102 receives inputs from some logic 104 and produces outputs used by some other logic 106. Embedded cores typically are supplied by the vendor along with a set of test patterns which, if applied in isolation, will produce 99% fault coverage. However, these patterns cannot usually be applied to the embedded core in isolation, because the core is buried inside the ASIC with no direct access to the core's primary inputs and primary outputs. Hence it is not possible to apply the supplied set of test patterns to the core in isolation unless some mechanism is supplied for accessing the core.

Among the isolation schemes that have been proposed are multiplexed isolation, boundary scan wrapped around the core, and test protocol expansion used for macro testing. All of these proposed techniques result in area and performance overhead, which may make these technique unacceptable for many applications.

A second possible type of approach is to generate new test vectors which will be applied at the ASIC level. Test pattern generation software is well known in the art, and is usually provided by third party vendors. Although it is possible for the ASIC vendor to generate a complete set of test vectors to test the customer's ASIC, many customers demand that third party vendors be capable of taking the customer's ASIC design and generating test vectors for it, without requiring any further assistance from the vendor.

The input to a test pattern generation program is typically a flattened ASIC netlist. The flattened netlist describes the complete ASIC in terms of primitives such as AND and OR gates, and their functional interconnections. The netlist is described as flattened because the cores, which are hierarchical functional blocks, have been reduced to their constituent primitives and interconnections. Using the flattened netlist, the test pattern generation software is able to generate test patterns that will test the ASIC with an extremely high percentage of fault coverage.

The problem with which a present invention is concerned is that supplying a flattened netlist to the customer from which the third party's test pattern generator software can generate test patterns to test the entire ASIC, conflicts with the goal of keeping the detailed design of cores confidential.

The flattened netlist for the core comprises much of the proprietary design details that the ASIC vendor desires to keep confidential.

SUMMARY OF THE INVENTION

Accordingly, it is an object of the present invention to provide an ASIC customer with a method of testing an ASIC without supplying to the customer netlist information from which the customer can reverse engineer proprietary vendor information such as the detailed design of ASIC cores.

It is a further object of the present invention to provide a method of increasing the number and percentage of gates within a logic block such as an ASIC core, that can be substantially fully tested using only a dedicated test port.

It is yet an additional object of the present invention to provide a method of increasing the percentage of an ASIC that can be tested without controlling functional inputs to the ASIC and without observing functional outputs from the ASIC.

It is a still further object of the invention to provide a customer with a reduced core netlist and a set of test vectors, such that the customer can generate test vectors for the portion of the core reflected in the netlist, and can test the portions of the core not reflected in the netlist by applying the supplied test vectors to a core serial scan port.

It is an additional object of the invention to efficiently determine which non-scan I/O nodes of a core can most profitably be replaced by scan I/O nodes, so as to further reduce a netlist and hence protect additional proprietary information contained within the unreduced netlist.

According to the present invention, gates within a logic block such as an ASIC core that presently require the use of functional I/O signals to test, are identified. Given the core's present design, these gates cannot be tested using only boundary scan techniques, because they cannot be isolated from non-scan I/O's and tested in isolation from such non-scan I/O's. The present invention identifies those non-scan I/O's that can be most profitably replaced by scan I/O's, so as to increase the number and percentage of gates that can be fully tested using only a boundary scan test port, and hence eliminated from the netlist which is given to a customer.

In one embodiment, a weight is assigned to each gate that presently requires the use of functional I/O signals to test. Higher weights are assigned to gates within sections of the core that are more competitively sensitive. Next, for each non-scan I/O node, all gates are identified that are within the output cone or the input cone of that node, i.e., presently cannot be isolated from that node for testing. Each non-scan I/O node is then assigned a value. The value equals the sum of the weights of all the gates that are within an input cone or an output cone of that gate. The set of non-scan I/O's to be replaced by scan I/O's is chosen so as to maximize the weight of gates rendered testable.

Because the overall method described can be computationally complex for large cores, refinements to the method to make it more computationally manageable are also presented. According to a second embodiment, the maximum number b of scan I/O's to be replaced is determined. If any gate is within the input cone or output cone of more than b nodes, then that gate's weight is set to zero, because it will not be possible to render that gate testable in isolation from functional nodes. The value of each non-scan I/O node is then computed, and the node with the single highest value is chosen. Next, if any gate is within the input cone or output cone of more than b−1 gates, the weight of that gate is also set to zero. Values of all remaining unchosen I/O nodes are recalculated, and the remaining node with the greatest value is also replaced with a scan node. The process is repeated until all b nodes have been chosen.

As yet a further refinement to the method, performance-critical non-scan I/O nodes are identified before the elimination process is begun. These are nodes that cannot be replaced by scan nodes due to timing considerations. These nodes are eliminated from consideration for replacement. Furthermore, because any gate that is within the input cone or output cone of this node can never be rendered testable in isolation from this performance-critical node, any such gate is assigned a weight of zero. Additional refinements and variations are also presented.

The above-described objects of the present invention and other features and benefits of the present invention will become clear to those skilled in the art when read in conjunction with the following detailed description of a preferred illustrative embodiment and viewed in conjunction with the attached drawings in which like reference numerals refer to like parts, and the appended claims.

DETAILED DESCRIPTION OF THE INVENTION

To reduce the amount of detailed implementation information for a core that must be given to an ASIC customer, a test shell will be generated by the ASIC vendor. A test shell includes an incomplete (reduced) netlist for the core, as well as a set of test vectors that will test the portion of the core eliminated from the netlist. The test vectors are applied to the core via a test port, such as a serial boundary scan port. In test mode, the portion of the core that has been eliminated from the netlist can be substantially completely tested using only the test port, and the remainder of the core can be substantially completely tested in isolation from the eliminated portion. This approach will be explained with reference to an example.

Figure 2:
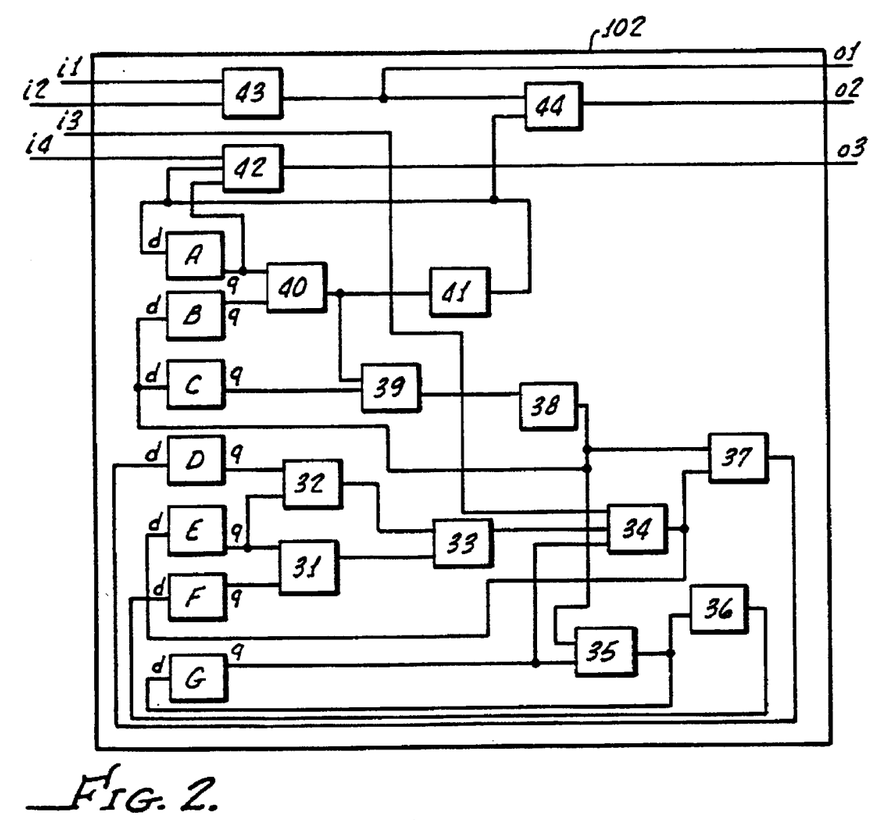
FIG. 2 is a detailed structural drawing of an example ASIC core.

FIG. 2 is a detailed structural drawing of an example ASIC core. Core 102 has 4 primary inputs (i1, i2, i3, and i4)

and 3 primary outputs (o1, o2, and o3). The scan flip-flops within the circuit are labelled A through G. Combinatorial gates and non-scan flip-flops are assigned numerical reference designators 31 through 44. Because only structural analysis will be performed, the type of combinatorial gates (i.e., AND, OR, etc.) does not affect the analysis.

Scan flip-flops are capable of behaving like inputs and outputs when the scan cells are activated via scan control. For these reasons, they are referred to as pseudo-primary inputs and pseudo-primary outputs. When the scan cells are activated, any traversal from the primary inputs to the primary outputs will stop whenever it reaches a scan flip-flop. If any flip-flop is not a scan flip-flop, then for the present analysis it will be grouped with the combinatorial gates. Traversal will not be considered to stop at non-scan flip-flops.

Figure 3:
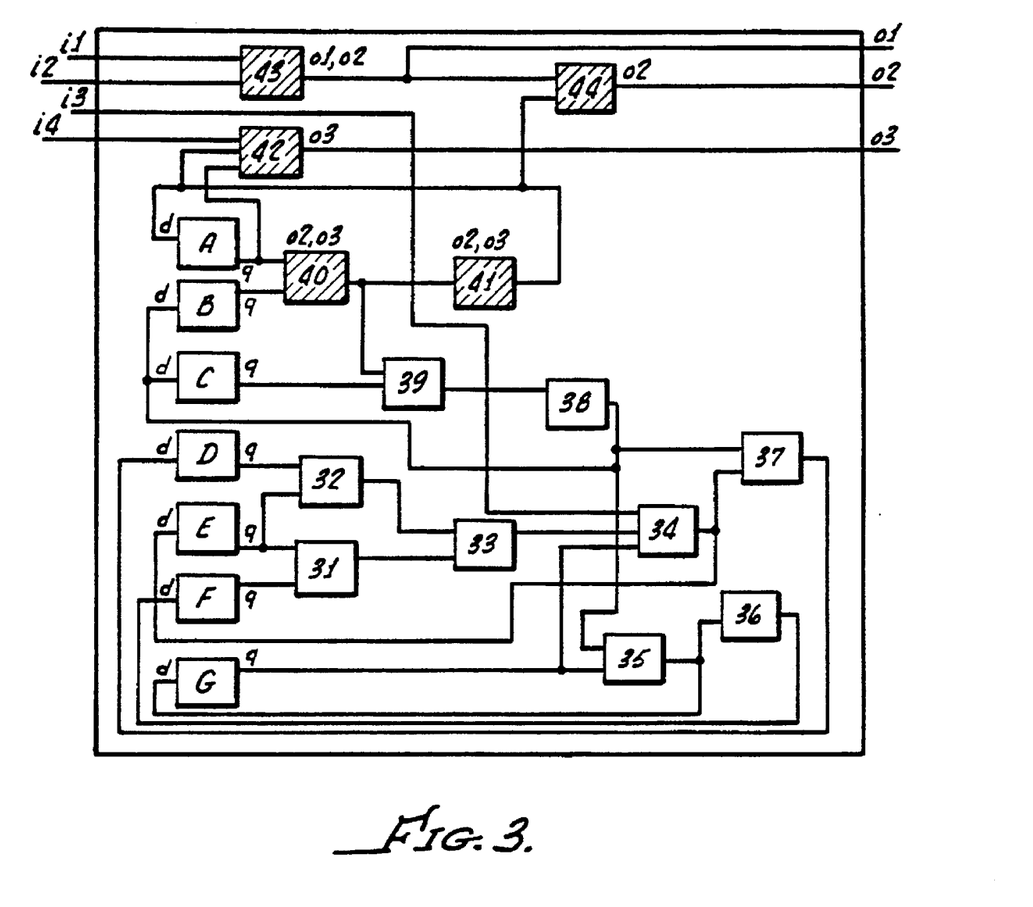
FIG. 3 illustrates the input cone of the primary outputs for the example core of FIG. 2.

FIG. 3 illustrates gates that are said to be within the input cone of the primary outputs. These are gates from which signals propagate directly to the primary outputs, without being interrupted by a scan cell. The only way to test the functionality of these gates is by knowing the inputs to these gates and by observing the primary outputs (the functional output signals). The gates are marked with the outputs to which they are connected. For example, gate 41 influences primary outputs o2 and o3. It is connected (indirectly) to both of these outputs. Gate 41 cannot be tested without observing at least one of o2 and o3.

Figure 4:
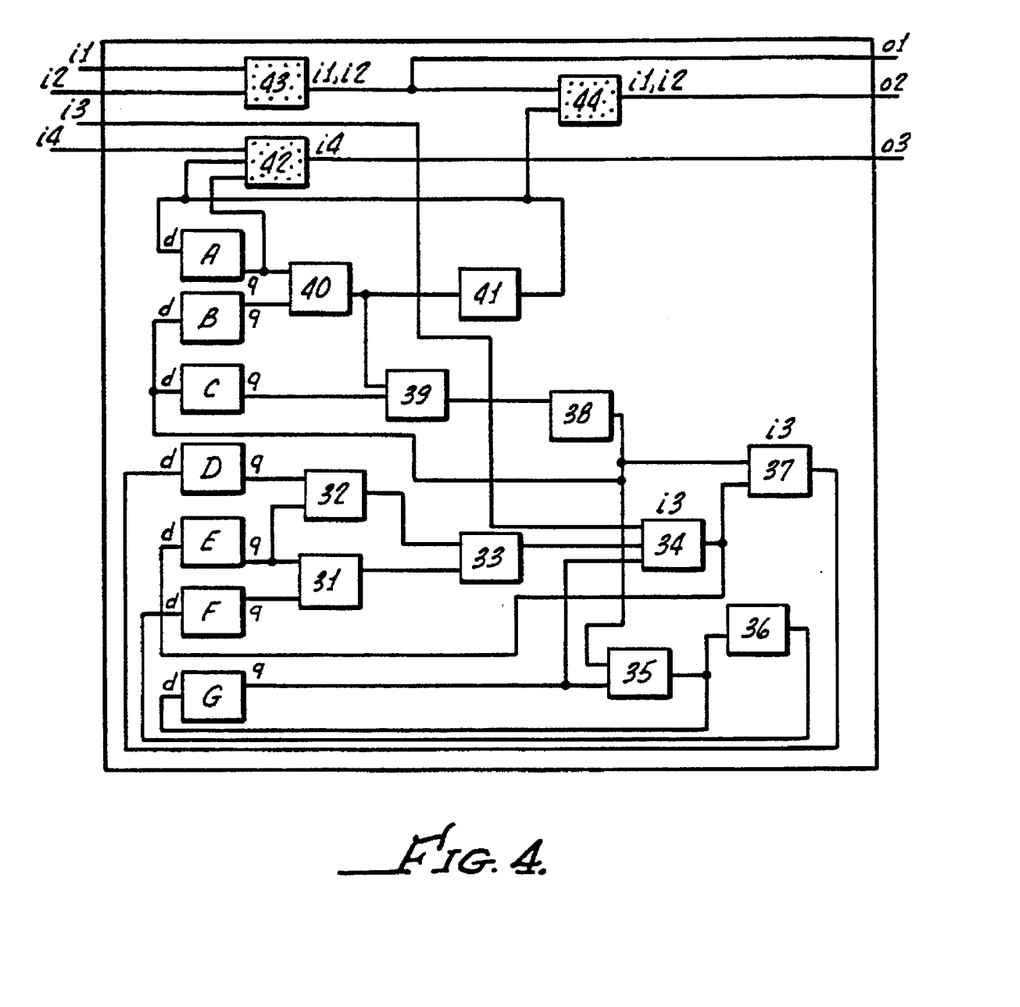
FIG. 4 illustrates the output cone of the primary inputs for the core of FIG. 2.

FIG. 4 illustrates gates that are said to be within the output cone of the primary inputs. These are gates to which a signal propagates from at one least primary input without the signal being interrupted by a scan cell. For this reason, it is not possible to test such a gate in isolation from the primary input, because knowledge and/or toggling of the primary input (the functional input) is always required in order to test the functionality of the gate. The input cone gates are marked with the inputs to which they are connected. For example, gate 37 is connected (indirectly) to i3. It cannot be tested without toggling i3, or at least controlling i3 to ensure that it is a non-controlling input to gate 34 (1 if gate 34 is an AND gate, 0 if an OR gate, etc.).

Figure 5:
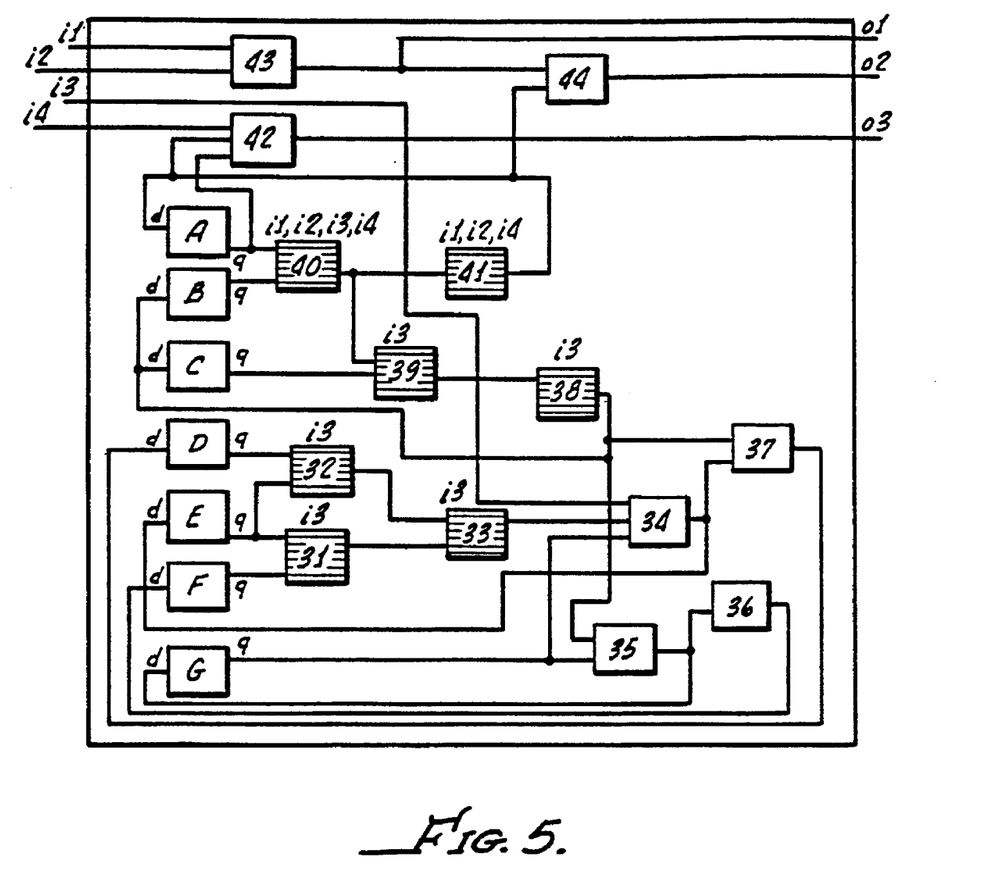
FIG. 5 illustrates the side inputs for the core of FIG. 2.

FIG. 5 illustrates the concept of side input gates. Gates are said to be side input gates if they are connected (directly or indirectly) to gates that are within the output cone of the primary inputs. These gates are also not testable in isolation from the primary inputs. For example, gate 31 cannot be tested without toggling or at least controlling i3, because the output of gate 31 cannot be tested until after gate 37, at which point the output from gate 31 has already "merged" with i3 at gate 34. The side input gates are marked according to the inputs with which they merge.

Figure 6:
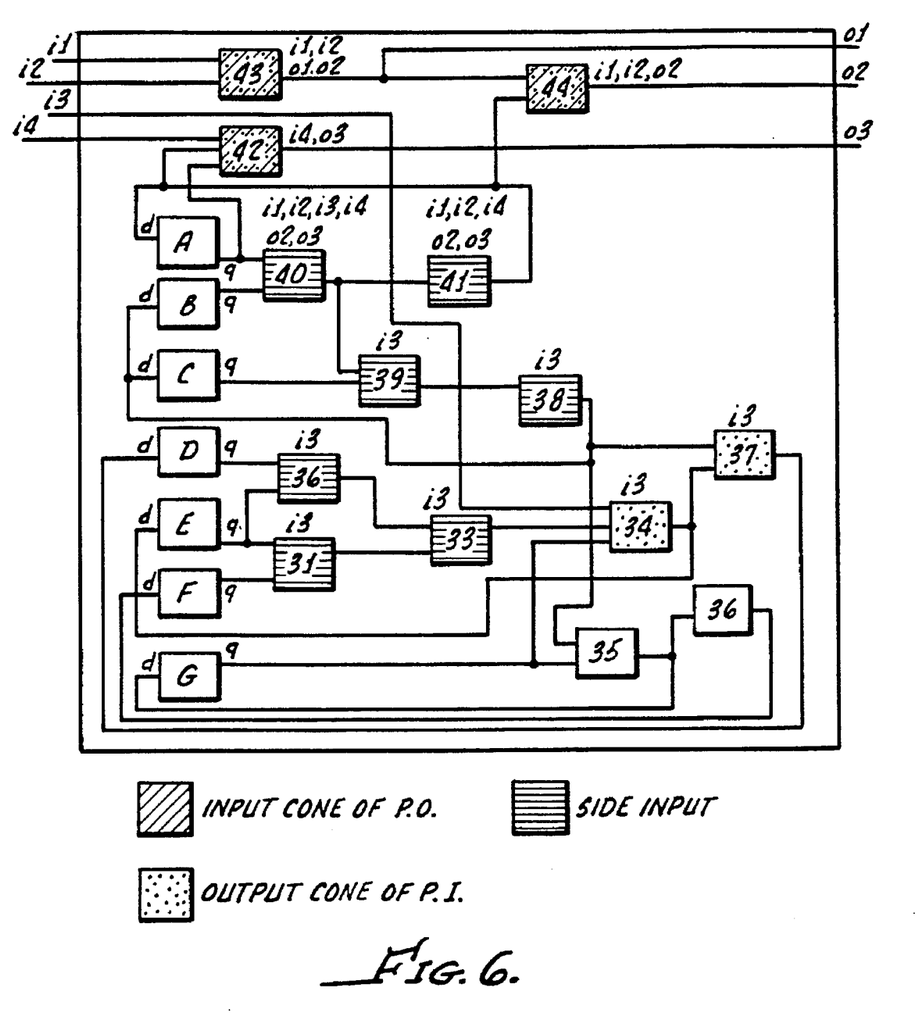
FIG. 6 illustrates the complete labelling of gates within the core of FIG. 2.

The complete marking of the circuit is shown in FIG. 6. For present purposes, all of the marked gates are said to be "connected" to at least one primary input or at least one primary output. A gate is said to be connected to a node if it cannot be tested in isolation from the functional input or output signal at that node.

It will be observed at this point that there is one class of gates remaining. This is the class of gates (gates 35 and 36) that are not marked. The characteristics of this class are that the gates within this class (1) do not require any primary inputs to test (only gates within the output cone of the primary inputs, and side input gates require primary inputs to test), and (2) do not require observing primary outputs to test (are not within the input cone of the primary outputs). Stated another way, using scan cells these gates may be completely tested in isolation from any of the primary inputs or primary outputs. When the scan cells are activated, these gates are logically isolated from the rest of the core. They do not affect the rest of the core, and the rest of the core does not affect them. These gates are said to be "disconnected" from primary inputs and primary outputs.

Scan cells are usually connected in series in a single serial scan chain, accessible via a serial scan port. Thus, gates 35 and 36 can be completely tested via the serial scan port. The software vendor can generate test vectors to be applied via the test port that will fully test these gates. Furthermore, the remainder of the core can be tested independently of these gates. For this reason, the test vector generator does not need any information about these gates to generate test vectors that will fully test the rest of the core. All information concerning these gates can be removed from the netlist. They are said to be removable gates.

The core has thus been conceptually divided into two portions. During normal operating mode, the two sections operate together. The first portion comprises removable gates that can be completely isolated in test mode from the rest of the core and tested via a serial scan port, using test vectors generated by the ASIC vendor. The second portion can be completely isolated from the removable gates, and tested without knowing the functionality or any implementation details of the removed logic. The customer will generate test vectors for testing this second portion. These test vectors will test the ASIC using the primary inputs and primary outputs as well as the scan test port. Combining the test vectors generated by the customer with the test vectors supplied by the vendor, the ASIC can be fully tested by the customer, without revealing to the customer certain implementation details of the core.

Figure 7:
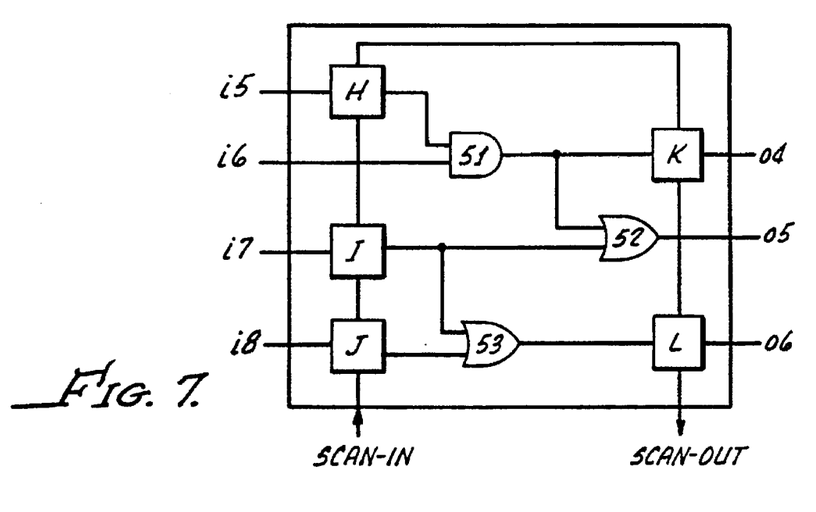
FIG. 7 illustrates the concept of testable I/O nodes and testable gates.

FIG. 7 illustrates testability of I/O nodes and gates. The boxes with letter designations H through L represent scan flip-flops. These are nodes which may be forced to a desired value in the case of inputs, and which may be observed directly in the case of outputs, using the serial scan chain. For present purposes, a node will be termed to be "testable" if it is either an input node that can be forced to a desired value, or if it is an output node that can be observed directly. A node is "untestable" if it is neither of these. Input nodes i5, i7, and i8 are testable. Input node i6 is untestable. Output nodes o4 and o6 are testable. Output node 5 is untestable.

It will be observed that gate 53 can be completely tested using only the scan chain. It is "disconnected" from all untestable I/O nodes. Gates 52 and 53 require functional inputs and/or outputs to test. They are "connected" to untestable nodes.

For present purposes, a gate will be said to be "untestable" if it is connected to an untestable node, and "testable" if it is not connected to any untestable node. The step of "disconnecting" a gate from an untestable node denotes replacing the untestable node with a testable node. Although these are non-standard definitions of the terms "testable" and "untestable" gates and nodes, and "disconnecting" a gate from a node, these definitions serve as convenient shorthand for the discussion and claims that follow.

The core has already been conceptually divided into a testable portion and an untestable portion. To improve the number and percentage of gates within the circuit that are testable, hence allowing the netlist to be further reduced thus protecting additional proprietary information from disclosure, additional inputs can be rendered controllable and additional outputs can be rendered observable by replacing untestable I/O nodes with testable I/O nodes.

Scan cells are the most common method of adding such controllability and observability, although other techniques are available such as multiplexing of test data onto individual signal lines or entire buses. For example, the contents of a counter can be placed onto a data bus and read out via the core's normal data port, thus calling the data bus into service as a test port during the read operation for the purpose of observing and testing the counter. Although many such techniques exists or can be developed that are alternatives to scan cells, the present discussion will focus on the use of scan cells to provide testability. This focus is only for the purpose of presenting exemplary embodiments of the present invention, and is not intended as a limitation. It is further noted that typically, a single test port is used that comprises an input line, an output line, and a control line, for a total of three I/O pins. This test port connects to a single scan chain running through the entire core. Other test port configurations are possible, including test ports having a different number of pins with correspondingly different functions, as well as multiple test ports and multiple scan chains. It is to be understood that references herein to a test port encompass such other alternative arrangements.

A gate can be removed from the netlist if it is disconnected from all functional inputs and all functional outputs. Any non-scan I/O's to which the gate is connected must be replaced with scan I/O's before the gate may be removed from the netlist. When choosing which non-scan I/O's to replace with scan I/O's, I/O's should be chosen so that the combination of I/O's to be replaced results in the maximum amount of proprietary information that will be protected by removing gates from the netlist.

A weight is assigned to each untestable gate. The weight represents the relative value to the ASIC vendor of removing that gate from the netlist. A gate is assigned weight 0 if the gate is present in the timing shell. This is because that gate is already available to the customer in the timing shell. There would be no value to be gained in removing it from the netlist. If the gate is not present in the timing shell, then it is assigned a weight of 1. The gate is further assigned a weight of 2 if it is not present in the timing shell, and it is within an area predetermined by the core designer to be more competitively sensitive than other areas. Of course, various relative weights could be assigned depending on whether an area is designated slightly competitively sensitive, more sensitive, extremely sensitive, etc. The core designer will also input a number b, which is the maximum number of non-scan I/O which, due primarily to chip real estate considerations, will be allowed to be replaced by scan I/O.

Figure 8:
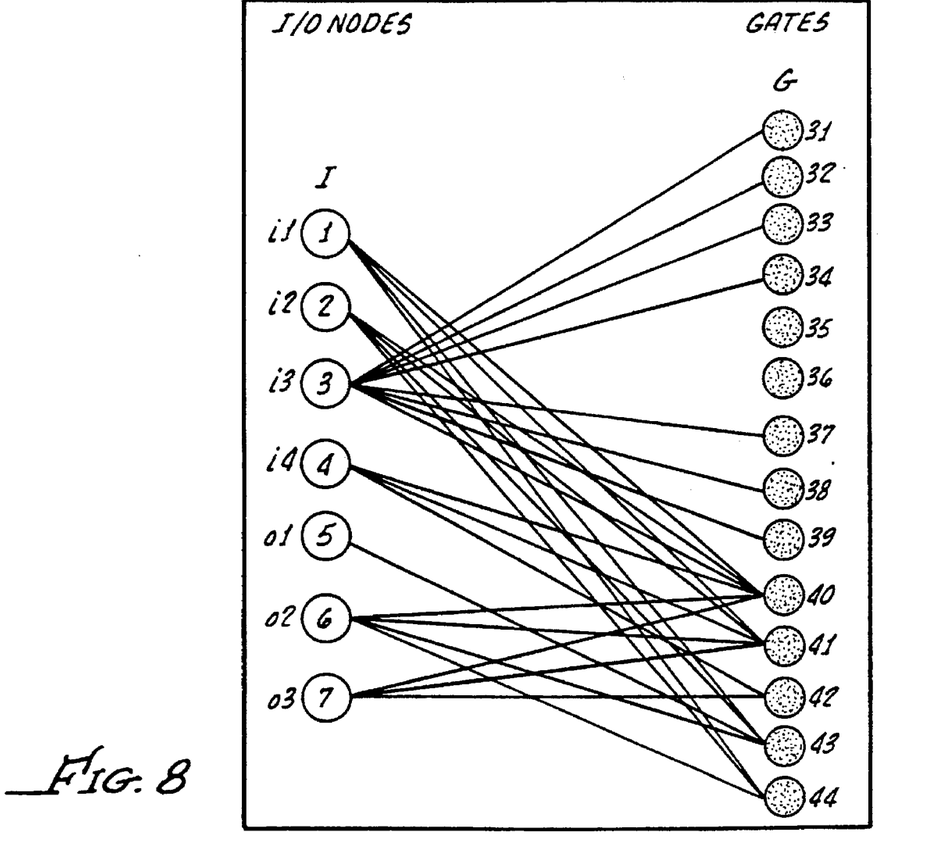
FIG. 8 is an influence graph for the core of FIG. 6.

The problem can be viewed in the graph theory domain, as shown in FIG. 8. This figure shows a bipartite graph called an influence graph for the circuit. On the left hand side, a set of nodes is created, one for each untestable I/O. This set of nodes will be termed the I-set. For bidirectional nodes, one input node and one output node is created. This is because for a bidirectional node, the core designer can choose to make only the input a scan node, the output a scan node, or both. Hence, making separate nodes for inputs and outputs results in more flexibility for the optimization process.

On the right hand side of the graph, another set of nodes representing gates is created, one for each gate in the circuit. This set of gates is called the G-set. For each gate in the circuit, a unidirectional edge is added from that gate to every I/O to which that gate is connected.

The problem is now reduced to the problem of choosing a set of nodes of size b from the I-set such that by removing those I/O nodes, the sum of weights of the disconnected gates in the G-set is maximized. A gate in G-set is called disconnected if it has no edge to any I/O node in the I-set.

Let the number of entries in I-set be n. We want to choose b nodes from the I-set so that after removing them the sum of weights of the disconnected gates in the G-set is maximized. An optimal solution is to generate all possible combinations of size b from the I-set and for each combination, compute the sum of weights of the disconnected nodes in the G-set. Then choose that combination which maximizes the sum of weights of the disconnected nodes in the G-set. The number of possible combinations of size b from the I-set is:

$$\frac{n!}{b!(n-b)!}$$

The maximum complexity of this calculation is $O(n^b * g)$. This becomes a very large number for values of $b>3$.

A second approach that also theoretically yields an optimal solution is to express the problem as a 0–1 integer programming problem. To do so, begin by denoting a set of variables, $X_1, X_2, \ldots X_n$, one for each node in the I-set. The variable $X_i=1$ denotes that the ith node in the I-set is selected and $X_i=0$ denotes that the ith node is not selected.

Denote a second set of variables, $Y_1, Y_2, \ldots Y_g$, one for each gate in the G-set. The variable $Y_j=1$ denotes that the jth gate in the G-set will be disconnected and $Y_j=0$ denotes that the corresponding gate will not be disconnected. These variables in the X and Y set are boolean variables that can take on values from the set $\{0,1\}$. For the influence graph shown in FIG. 8, the integer programming problem is expressed as follows:

Maximize $(Y_{31} * \text{weight}(Y_{31}) + \ldots + Y_{44} * \text{weight}(Y_{44}))$ subject to the following constraints:

| | |
|---|---|
| (1) $X_3 - Y_{31} >= 0$ | For gate 31 |
| (2) $X_3 - Y_{32} >= 0$ | For gate 32 |
| (3) $X_3 - Y_{33} >= 0$ | For gate 33 |
| (4) $X_3 - Y_{34} >= 0$ | For gate 34 |
| (5) $X_3 - Y_{37} >= 0$ | For gate 37 |
| (6) $X_3 - Y_{38} >= 0$ | For gate 38 |
| (7) $X_3 - Y_{39} >= 0$ | For gate 39 |
| (8) $X_1 + X_2 + X_3 + X_4 + X_5 + X_6 + X_7 - 6*Y_{40} >= 0$ | For gate 40 |
| (9) $X_1 + X_2 + X_4 + X_6 + X_7 - 5*Y_{41} >= 0$ | For gate 41 |
| (10) $X_4 + X_7 - 2*Y_{42} >= 0$ | For gate 42 |
| (11) $X_1 + X_2 + X_5 + X_6 - 4*Y_{43} >= 0$ | For gate 43 |
| (12) $X_1 + X_2 + X_6 - 3*Y_{44} >= 0$ | For gate 44 |
| (13) $X_1 + X_2 + X_3 + X_4 + X_5 + X_6 + X_7 >= b$ | |

This 0–1 integer programming problem is an NP-complete problem, which has no known closed form solution. This type of problem is well-known to mathematicians, as discussed for example in COMPUTERS AND INTRACTABILITY: A GUIDE TO THE THEORY OF NP-COMPLETENESS, by Michael R. Gary and David S. Johnson (1979).

Although the optimal solution can be computationally prohibitive, a practical heuristic solution is presented herein. In the present invention, one I/O is chosen at a time. Hence, the problem complexity always remains linear with respect to the number of I/O's. The practical solution makes use of the observation that a gate in the G-set can become disconnected if and only if all the nodes in I-set to which that gate has edges, is selected. Hence during the I/O selection process, if only m I/O's remain to be selected, then a gate which has more than m edges which are connected to unselected I/O's, can never be completely disconnected. A pseudo-code representation of the selection routine is given below:

```
IO_select_heur (int max_select)
{
num_selected=0;
unselect all the nodes in the I-set
unmark all the edges in the influence graph
while(num_selected < max_select) {
    for every unselected node in the I-set {
        val (node)=0;
        for every gate in G-set which is connected to node {
            if(num_unmarked_edge(gate) < (max_select-
            num_selected))
                val(node)=val(node)+weight(gate);
        }
    }
Find the node with maximum val from the I-set;
select that node;
mark all the edges connected to node;
num_selected=num_selected + 1;
    }
}
```

In the first iteration, the value of each node in the I-set is computed. The value of a node is defined as the sum of weights of all gates in the G-set which are connected to that node and are connected to less than max_select nodes in the I-set. The node with the maximum value is chosen and that node is marked as having been changed to a scan node. All the edges connected to that node are marked. If any gate in G-set has only marked edges connecting to it, then that gate has been rendered testable and thus eliminated. The value of each node in I-set is recomputed. When the value of a node is recomputed, the weight of a gate connected to that node is added to the value of the node only if that gate has fewer unmarked edges than the number of I/O's still to be selected. This is due to the fact that the number of unmarked edges to a gate in G-set indicates the number of nodes connected to that gate which are not selected. If the number of unselected nodes is greater than the number of I/O's still to be selected, then that gate can not be removed from the test shell irrespective of how the remaining I/O's are selected. Then for subsequent iterations, only the remaining nodes in the I-set are considered. The node having the highest value is chosen, and that node and all the edges connected to that node are marked. The process is continued until the desired number b of I/O's have been selected. The maximum complexity of the process is $O(n*g*b)$.

In order to make a further refinement to the above method, it is noted that in many designs some of the inputs and outputs will be performance critical such that the critical timing of the circuit will not allow for an additional multiplexer delay. For those I/O's, boundary scan logic can not be inserted. When performance critical I/O's are identified, either manually or by automatic means, these I/O's are removed from consideration. Next, all gates that are connected to these I/O's are assigned a weight of zero, because it is not possible to completely disconnect these gates from non-scan I/O's. Hence, during the selection procedure, these gates will have no effect on the decisions made as to which I/O's to replace with scan I/O's. Furthermore, only I/O's that are not performance-critical will be selected.

Figure 9:
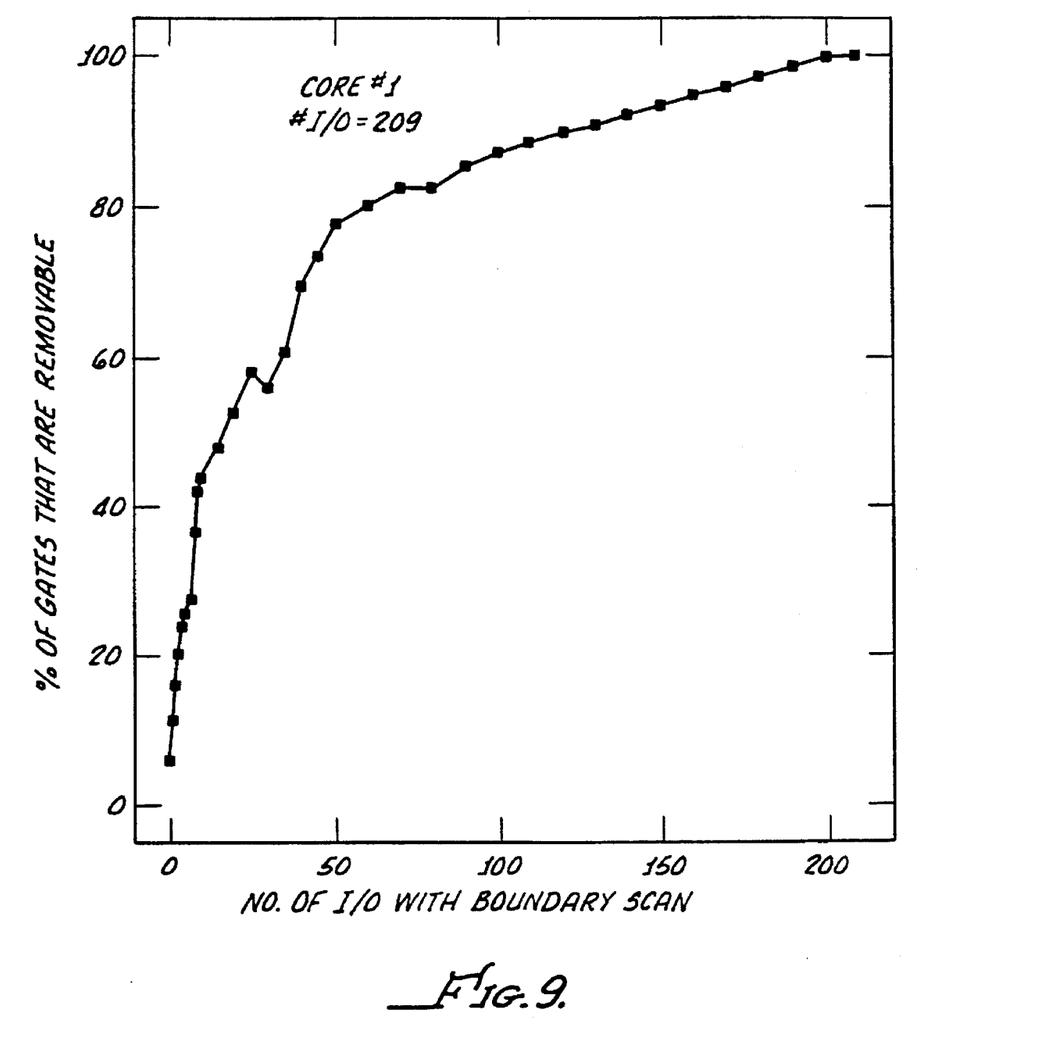
FIG. 9 is a graph showing the number of gates rendered removable vs. number of non-scan I/O's replaced by scan I/O's, for a first test core.
Figure 10:
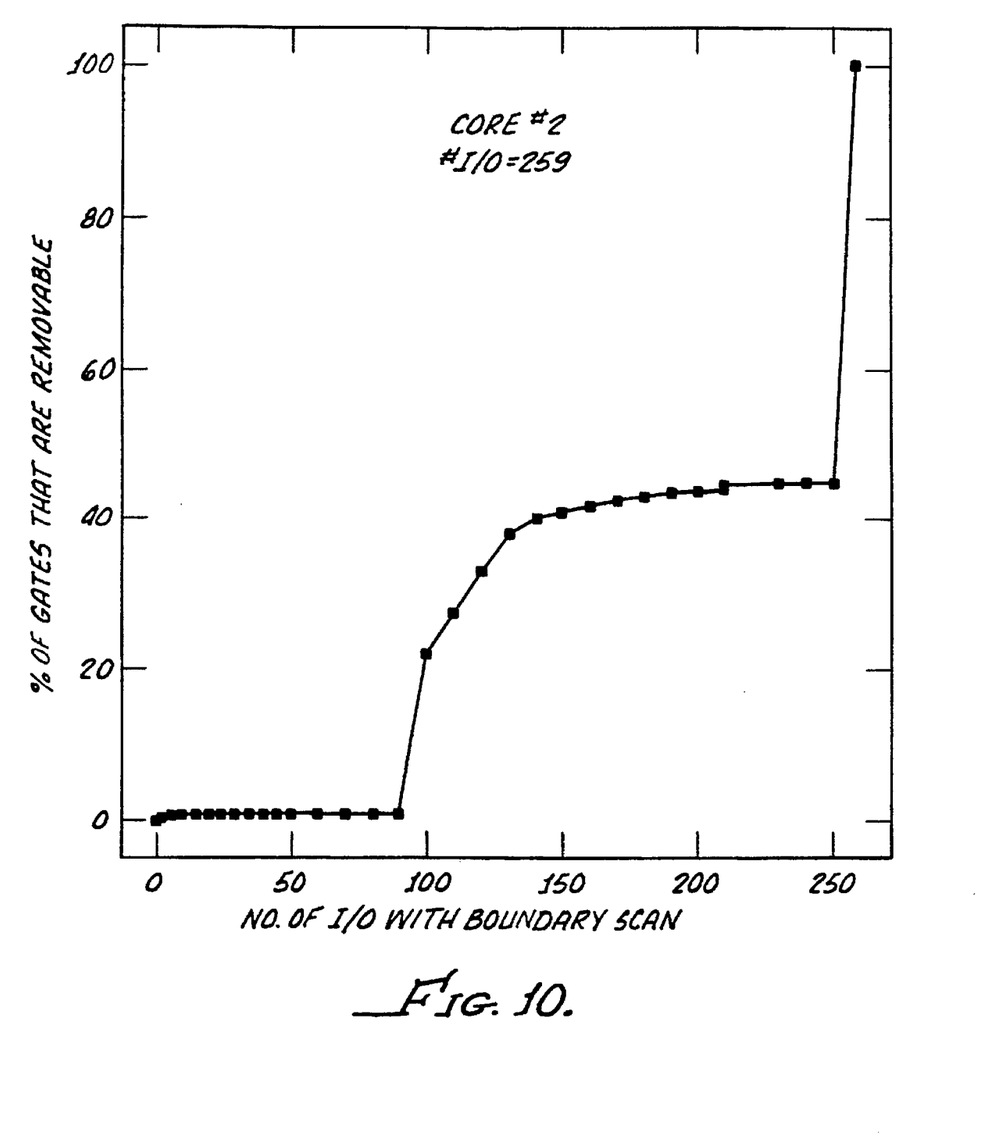
FIG. 10 is a graph showing the number of gates rendered removable vs. number of non-scan I/O's replaced by scan I/O's, for a second test core.
Figure 11:
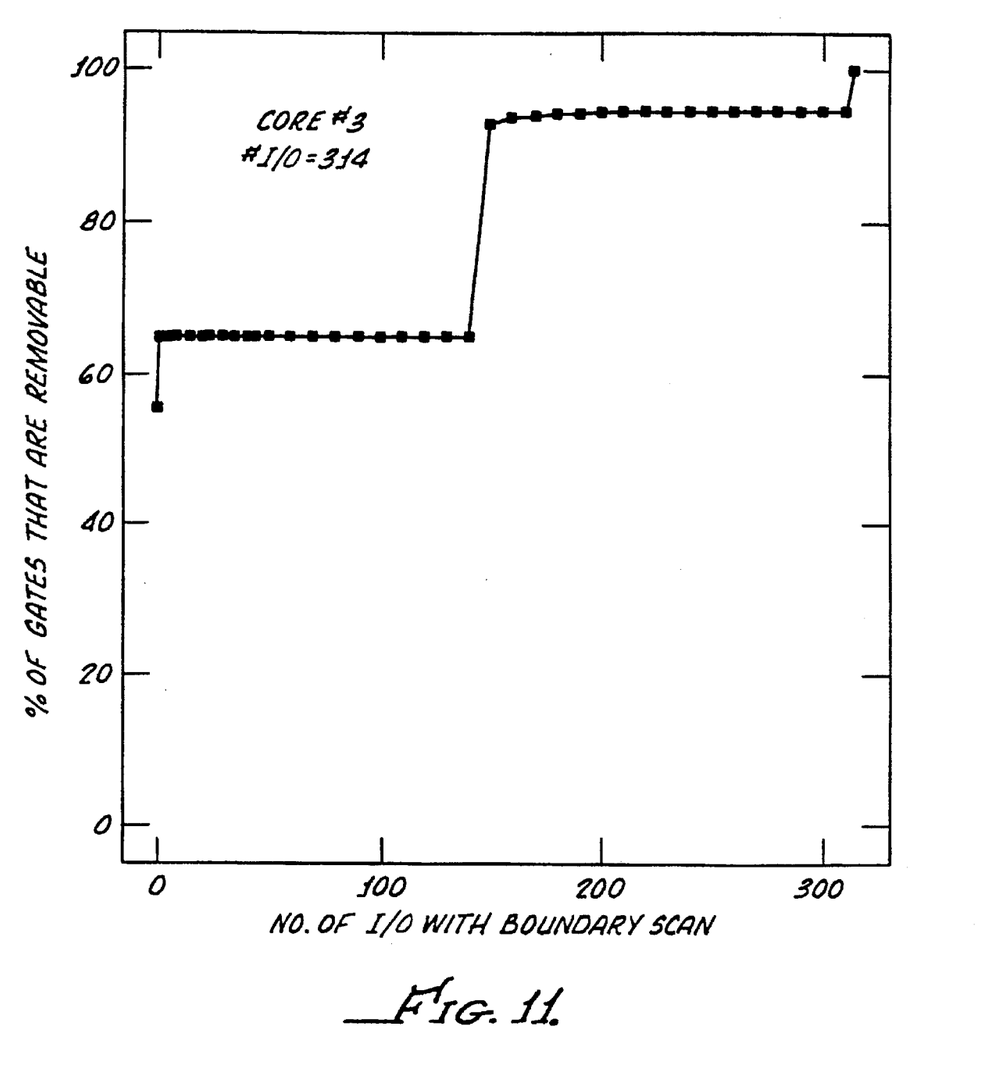
FIG. 11 is a graph showing the number of gates rendered removable vs. number of non-scan I/O's replaced by scan I/O's, for a third test core.

The method of the present invention was applied to three existing core designs used as test cases. FIGS. 9-11 are plots of the results, showing what percentage of the gates within each core were rendered removable from the netlist for various numbers of I/O's selected to be replaced with scan I/O's. The point where the x-axis is zero represents the percentage of gates that were removable before any I/O's were replaced with scan I/O's. As the figures demonstrate, the shapes of the curves as well as the zero-values differ significantly. For core #1 in FIG. 9, the number of removable gates started at less than 10% and increased dramatically with the number of scan I/O's added. For core #3 in FIG. 11, a very large design with 314 I/O's and approximately 60,000 gates, the design did not require any I/O's to be replaced because 55% of the gates were removable from the test shell without adding any boundary scan. By selecting a single I/O, the percentage of removable gates jumped to 65%, then remained flat until 150 I/O's were selected, at which point the figure jumped to 95%. These results demonstrate the value of the present method for identifying where the greatest returns may be realized by adding scan cells.

Writing a complete computer program to implement the method of the present invention as well as variations presented herein, is within the capabilities of the person of ordinary skill in the art of software.

Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A method of increasing a number of gates within a logic block that may be substantially fully tested via only a test port, such that said substantially fully testable gates may be removed from a netlist representing the logic block, the logic block including logic gates, non-scan I/O's, and interconnections therebetween, the method comprising the steps of:

a) determining a number b of non-scan I/O's to be replaced with scan I/O's;

b) for each of a plurality of said gates within the logic block, assigning an initial weight to the gate according to a perceived desirability of eliminating said gate from the netlist; and repeatedly performing the steps of:

c) determining the number of non-scan I/O's remaining to be replaced with scan I/O's;

d) replacing the weight assigned to a given gate with a weight of zero if the number of non-scan I/O's remaining to be replaced with scan I/O's is less than the number of non-scan I/O's connected to said given gate;

e) for each of a plurality of non-scan I/O's within said logic block, computing the sum of the weights of gates connected to said non-scan I/O's;

f) assigning to each of said plurality of non-scan I/O's within said logic block, a value equal to said sum of weights computed for said non-scan I/O;

g) determining the non-scan I/O having the greatest value; and h) replacing said non-scan I/O having the greatest value with a scan I/O.

2. The method defined in claim 1, wherein said initial weight assigned to a gate is equal to:

i) zero if the gate is present in a timing shell for the logic block;

ii) a first non-zero value if the gate is not present in a timing shell for the logic block and the gate is not predetermined to be highly confidential; and iii) a second non-zero value if the gate is not present in the timing shell and the gate is predetermined to be highly confidential, said second non-zero value being greater than said first non-zero value.

3. The method defined in claim 2, wherein the initial value assigned to a gate is further set equal to zero if the gate is connected to an I/O determined to be performance-critical.

4. A method of increasing a number of gates within a logic block that may be substantially fully tested via a test port, the logic block including untestable I/O nodes, logic gates, and interconnections therebetween, the method comprising the steps of:

a) designating a first candidate set of untestable I/O nodes;

b) designating a second candidate set of untestable I/O nodes;

c) identifying a first set of gates, said first gate set comprising gates that are connected to the first candidate I/O node set;

d) identifying a second set of gates, said second gate set comprising gates that are connected to the second candidate I/O node set;

e) determining the relative desirability of testing said first and second gate sets independently from said first and second I/O candidate node sets, respectively; and f) in accordance with said relative desirability, either disconnecting said first gate set from said first I/O candidate node set, or disconnecting said second gate set from said second I/O candidate node set.

5. The method defined in claim 4, wherein step e) comprises the steps of:

e1) assigning to said first I/O candidate node set a first value, said first value calculated according to gates within said first gate set;

e2) assigning to said second I/O candidate node set a second value, said second value calculated according to gates within said second gate set; and e3) determining the greater of said first and second values.

6. The method defined in claim 5, wherein each step of assigning to an I/O candidate node set a value comprises the steps of:

g) assigning a weight to each gate that is connected to an untestable node within said I/O candidate node set;

h) computing the sum of the weights of gates that are connected to an untestable node within said I/O candidate node set;

j) assigning to the I/O candidate node set said sum of weights.

7. The method defined in claim 6, wherein each candidate I/O node set comprises a single I/O candidate node.

8. The method defined in claim 7, wherein step g) includes the step of:

g1) assigning a weight of zero to the gate if the gate is connected to an I/O node that is determined to be irreplaceable by a testable node.

9. The method defined in claim 8 wherein an I/O node is predetermined to be irreplaceable by a test node if the node is predetermined to be a performance critical node.

10. The method of claim 6, wherein the weight assigned to each gate is equal to:

i) zero if the gate is present in a timing shell for the logic block;

ii) a first non-zero value if the gate is not present in a timing shell for the logic block and the gate is not predetermined to be highly confidential; and iii) a second non-zero value if the gate is not present in the timing shell and the gate is predetermined to be highly confidential, said second non-zero value being greater than said first non-zero value.

11. The method defined in claim 4, wherein each step of disconnecting a gate set from a candidate I/O node set comprises the steps of:

f1) for each non-scan node within said candidate I/O node set that is connected to at least one gate within said gate set, replacing said non-scan node with a scan node.

12. The method defined in claim 11, wherein each said scan node comprises a scan node connected in a serial scan chain.

13. The method defined in claim 4 wherein said logic block comprises an ASIC core logic block.

14. A computer readable memory capable of causing a general purpose computer to identify untestable I/O nodes within a logic block for replacement by testable I/O nodes for the purpose of increasing a number of gates within said logic block that may be substantially fully tested via a test port, the logic block including untestable I/O nodes, logic gates, and interconnections therebetween, the memory comprising instructions that perform the steps of:

a) designating a first candidate set of untestable I/O nodes;

b) designating a second candidate set of untestable I/O nodes;

c) identifying a first set of gates, said first gate set comprising gates that are connected to the first candidate I/O node set;

d) identifying a second set of gates, said second gate set comprising gates that are connected to the second candidate I/O node set;

e) determining the relative desirability of testing said first and second gate sets independently from said first and second I/O candidate node sets, respectively; and f) in accordance with said relative desirability, either disconnecting said first gate set from said first I/O candidate node set, or disconnecting said second gate set from said second I/O candidate node set.

15. A method of decreasing the amount of proprietary information regarding a logic block that is revealed in a netlist corresponding to the logic block, the method comprising the steps of:

k) providing an unreduced netlist corresponding to the logic block;

m) increasing a number of gates within the logic block that may be substantially fully tested via a test port according to the method defined in claim 4; and n) removing said substantially fully testable gates from said unreduced netlist to produce a reduced netlist.

16. The method defined in claim 15 further comprising the step of:

p) providing a set of test vectors to test said substantially fully testable gates via a test port.

17. In a logic block including a number n of non-scan I/O nodes, said logic block further including a set of logic gates presently requiring the use of non-scan I/O nodes to test, a method of designating non-scan I/O nodes for replacement by scan I/O nodes for the purpose of rendering logic gates testable independent from functional I/O signals, the method comprising the steps of:

a) determining a number b of said non-scan I/O nodes to be replaced by scan I/O nodes;

b) for each of said logic gates presently requiring the use of non-scan I/O nodes to test, assigning a weight to said logic gate according to the desirability of disconnecting said gate from functional I/O signals; and c) for each non-scan I/O node, assigning a value to said non-scan I/O node according to the weights of gates connected to said non-scan I/O node; and d) choosing a combination of non-scan nodes to be replaced by scan nodes, said chosen combination corresponding to the relative magnitudes of said values assigned to said non-scan I/O nodes.

18. The method defined in claim 17, wherein the number of non-scan nodes within said combination of non-scan nodes is a number b, and wherein step c) comprises the steps of:

e) computing the sum of the weights of gates that are connected to said b non-scan nodes; and f) assigning to said non-scan I/O node said sum of weights; and wherein step d) comprises the steps of:

g) for possible combinations of b non-scan nodes, computing the sum of values of non-scan nodes within said combination of b non-scan nodes; and h) choosing the combination of b non-scan nodes having the greatest sum of values.

19. The method defined in claim 17, wherein step h) comprises the steps of:

j) expressing connections between logic gates presently requiring the use of non-scan I/O nodes to test, and non-scan I/O nodes, as a 0–1 integer programming problem; and k) solving said 0-1 integer programming problem to maximize the weight of gates disconnected from non-scan I/O nodes.

20. The method defined in claim 17, wherein step h) comprises the step of:

j) choosing a combination of b) non-scan nodes, the value of each chosen node being greater than the value of each non-chosen node.

21. The method defined in claim 17, wherein step h) comprises the steps of iteratively:

j) determining a non-scan I/O node having the greatest value among non-scan I/O nodes previously not chosen;

k) choosing said non-scan I/O node having the greatest value;

m) recomputing the value of remaining unchosen I/O nodes; until b non-scan nodes have been chosen.

22. The method defined in claim 21 wherein step m) includes the step of:

n) assigning a value of zero to gates that are connected to z remaining unchosen I/O nodes, where z is greater than the number of I/O nodes remaining to be chosen.

* * * * *